United States Patent [19]

Mase et al.

[11] Patent Number: 5,261,156
[45] Date of Patent: Nov. 16, 1993

[54] METHOD OF ELECTRICALLY CONNECTING AN INTEGRATED CIRCUIT TO AN ELECTRIC DEVICE

[75] Inventors: Akira Mase, Aichi; Hideki Nemoto, Kanagawa; Shunpei Yamazaki, Tokyo; Yasuhiko Takemura, Kanagawa, all of Japan

[73] Assignee: Semiconductor Energy Laboratory Co., Ltd., Atsugi, Japan

[21] Appl. No.: 841,526

[22] Filed: Feb. 26, 1992

[30] Foreign Application Priority Data

Feb. 28, 1991 [JP] Japan ................... 3-58324
Feb. 7, 1992 [JP] Japan ................... 4-56783

[51] Int. Cl.⁵ ............................................. H01R 9/09
[52] U.S. Cl. ............................... 29/832; 156/64; 439/91
[58] Field of Search .................... 156/64; 439/66, 91, 439/591; 174/259, 117 A; 361/400; 29/832

[56] References Cited

U.S. PATENT DOCUMENTS 4,242,157 12/1980 Gehle ......................... 156/64
4,717,605 1/1988 Urban et al. ................. 156/64
4,811,081 3/1989 Lyden ......................... 357/80

Primary Examiner—Neil Abrams
Attorney, Agent, or Firm—Sixbey, Friedman, Leedom & Ferguson

[57] ABSTRACT

An integrated circuit is mounted on and electrically connected to an electric device with an adhesive therebetween. The adhesive comprises a photo-curable resin and a heat-curable resin. After mounted on the electric device, the integrated circuit is temporarily adhered to the device by exposing the adhesive to a ultraviolet light in order to cure only the photo-curable component of the adhesive. The operation of the electric device connected to the integrated circuit is then tested. If the integrated circuit is faulty, it is replaced. If faultless, the integrated circuit is permanently fixed to the electric device by heating to completely cure the adhesive.

18 Claims, 3 Drawing Sheets

METHOD OF ELECTRICALLY CONNECTING AN INTEGRATED CIRCUIT TO AN ELECTRIC DEVICE

BACKGROUND OF THE INVENTION

1. Field of the Invention

The present invention relates in general to a method of electrically connecting an integrated circuit to an electric device.

2. Description of the Prior Art

Liquid crystal display panels, thermal heads, LED arrays and so forth are usually driven by semiconductor integrated circuits which are mounted on separate printed circuit boards. FIG. 1 is a cross sectional view showing a conventional liquid crystal display system. The display comprises a liquid crystal panel 25 and a printed circuit board (called simply PCB for short hereinbelow) 21 connected with the liquid crystal panel 25 by means of flexible plates or rubber connectors 24. The PCB 21 is provided with necessary electrical devices thereon including packaged ICs 22. A problem, however, arises with such displays since the PCB requires a substantial space in the applications of the displays.

An attempt to solve the problem has been to mount IC chips directly on a PCB and to make electrical connection with the printed circuit by means of wire bonding followed by resin moulding protection. The PCB is then connected with a display panel through flexible panels. This configuration is called COB for short. Another approach has been to mount IC chips on a flexible film made of polyimide or the like and electrically connect Au bumps provided on the IC chips with a Cu circuit formed on the film and coated with Au to establish Au-Au contacts. The film provided with the IC chips is directly connected with a display panel in order to supply driving signals. This configuration is called TAB for short.

A further approach has been to mount IC chips directly on a substrate supporting a liquid crystal display device, a thermal head, a LED device or the like. Particularly, in the case of liquid crystal displays, this approach is called COG (chip on glass). A schematic view is illustrated in FIG. 2. A chip 32 is provided with conductive bumps 34 by means of which the chip 32 can make electrical connection with an ITO circuit 31 formed on a glass substrate 30 which is one of a pair of glass substrates between which a liquid crystal material is supported. Alternatively, the chip 32 is mechanically fixed to the glass substrate 30 by means of an organic adhesive 35. The electrical and mechanical connection of a chip 42 with an underlying glass substrate and an ITO circuit 41 can be established also by means of an organic adhesive 45 containing a number of conductive particles 44 as illustrated in FIG. 3. The conductive particles are disposed between and making electrical connection with a contact 43 formed on the chip and a circuit 41 formed on a glass substrate 40.

A serious problem arises with such a technique utilizing IC chips which have not been resin moulded and provided with no lead electrodes extending therefrom. It is often the case that some of the IC chips on the film or the substrate are faulty. In advance of being diced from a wafer, IC chips can be easily tested, e.g. by means of an IC tester. Test of chips can not be carried out after the dicing. Trouble of the chips, however, can occurs also in dicing and subsequent processes. The IC chips must be subjected under test after mounted on the substrate or the film and, if faulty, must be replaced from the substrate or the film by faultless chips. It is, however, very difficult to remove faulty chips from the substrate and correctly mount faultless chip instead. In the case that the chip is fixed by a photo-curable resin which is usually made of a modified acrylate resin, the resin has to be removed by a very strong solvent after completely cured. In the case of that the chip is fixed by an epoxy base photo-curable resin, the cured resin must be mechanically removed by applying thermal stress thereto since there is no solvent to solve the cured resin. In the case of that the chip is fixed by a heat-curable resin, the cured resin must be mechanically removed also by applying thermal stress thereto since there is no solvent to solve the cured resin. In either case, when an IC chip is removed from the substrate or the film, the surface of the substrate or the film tend to be in a such defective condition that fractions of the cured resin yet linger on the surface, that the circuit of the substrate or the film is partially rubbed off and that the surface becomes dirty so that it becomes difficult to make proper electrical connection again between the circuit of the surface and a faultless chip mounted in place of the faulty chip.

BRIEF SUMMARY OF THE INVENTION

It is an object of the present invention to provide a method of electrically connecting an integrated circuit to an electric device.

It is another object of the present invention to provide a method of electrically connecting an integrated circuit to an electric device wherein it is easy to find faulty articles of the integrated circuit and replace them by new articles.

It is a further object of the present invention to provide a method of electrically connecting an integrated circuit to an electric device wherein the electric device is not damaged even if replacement of the integrated circuit is repeated.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, an integrated circuit is connected to an electric device by mounting the integrated circuit on the electric device with an adhesive therebetween in order that terminals of the integrated circuit and the electric device to be electrically coupled are aligned with each other, the adhesive comprising a mixture of different substances which are cured in different conditions, curing one of the different substances in a first curing condition in order to temporarily adhere the integrated circuit to the electric device, testing operation of the electric device connected with the integrated circuit, and fixing the integrated circuit to the electric device by curing another of the different substances in a second curing condition different than the first curing condition. If the integrated circuit is found to be faulty by the testing step, the integrated circuit and the adhesive are removed and the mounting step, the curing step and the testing step are repeated with a new article of the integrated circuit. The fixing step is carried out only when the operation of the integrated circuit is found to be faultless by the testing step.

The electric device in accordance with the present invention may be a liquid crystal display panels, LED arrays, thermal heads or other similar devices which requires signals from external devices. The integrated circuit in accordance with the present invention includes general circuits such as ICs, e.g. monolithic ICs formed within a silicon semiconductor chip, hybrid ICs which may be provided with monolithic ICs thereon, thin film transistors formed on an insulating substrate or other similar circuits which supply control or data signals to the electric devices. In the case that the integrated circuit comprises a plurality of IC chips mounted on an insulating substrate such as a glass substrate, the plurality of IC chips can be preferably tested at once.

An adhesive is prepared by mixing organic resins which can be cured in different curing conditions. The organic resins include photo-curable resins, heat-curable resins, self-hardening resins and so forth. The different conditions include exposure to light rays having different wavelengths or heating at different temperatures. For example, the adhesive can be prepared by mixing 10 parts of a resin curable by a light having a wavelength of 350 nm and 90 parts of a resin curable by a light having a wavelength of 405 nm. In order to make ease the replacement of the integrated circuit temporarily adhered to the electric device, the proportion of the resin for temporary adherence is no higher than 20%, preferably no higher than 10%. On the contrary, in order to avoid separation of the integrated circuit temporarily adhered to the electric device, the proportion of the resin for temporary adherence is no lower than 2%.

In accordance with preferred embodiment of the present invention, a photo-curable resin and a heat-curable resin are mixed to prepare an adhesive with which an integrated circuit is temporarily adhered to an electric device. The mixed adhesive is dripped by means of a dispenser onto part of the electric device where the integrated circuit is to be mounted. The integrated circuit is mounted on the electric device in order that terminals of the integrated circuit are suitably aligned with corresponding electrode contact pads of the electric device. Then, the integrated circuit and the electric device are passed against each other to make electric connection between the pads and the terminals followed by exposing the adhesive to a ultraviolet light to temporarily adhere the circuit to the device. The operation of the integrated circuit is checked by testing the operation of the electric device connected with the integrated circuit. If the integrated circuit is faultless, permanent fixation is done by heating. If the integrated circuit is faulty, the faulty circuit is replaced by a new articles of the integrated circuit and subjected again to the test.

Since the resin used for temporary adhesion is mixed at a small proportion, the integrated circuit is easily removed from the electric device and the adhesive adhering to the electric device after removal of the faulty circuit can be completely removed so that a clean surface of the electric device can be reproduced for a new article of the integrated circuit to replace the faulty article. The proportion of the resins is selected depending upon the actual cases.

In the case that a photo-curable resin is used for preparing the adhesive, it must be possible to expose the adhesive between the integrated circuit and the electric device to a light. If the integrated circuit is opaque as a monolithic IC chip, the electric device has to be transparent. If the light used is a ultraviolet light, the electric device has to be formed of a material capable of transmitting the ultraviolet light such as quartz. Quartz, however, is expensive so as to rise the price of the electric device if it requires wide quartz glass substrates, like liquid crystal displays. On the other hand, there is few substrate which is transparent to ultraviolet light and cheap whereas there is few photo-curable resin which can be cured by visual or infrared light.

Accordingly, it is desirable that the integrated circuit is transparent. Such a circuit can be formed by fabricating thin film transistors and other necessary circuit elements on a small quartz substrate. Quartz is heat-resisting and can be used in high temperature processes at temperatures higher than 1000° C. which have been broadly utilized in conventional silicon semiconductor manufactures. Of course, low temperature processes at temperature up to 600° C. may be applied to fabricate the integrated circuit on a quartz substrate.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 4:
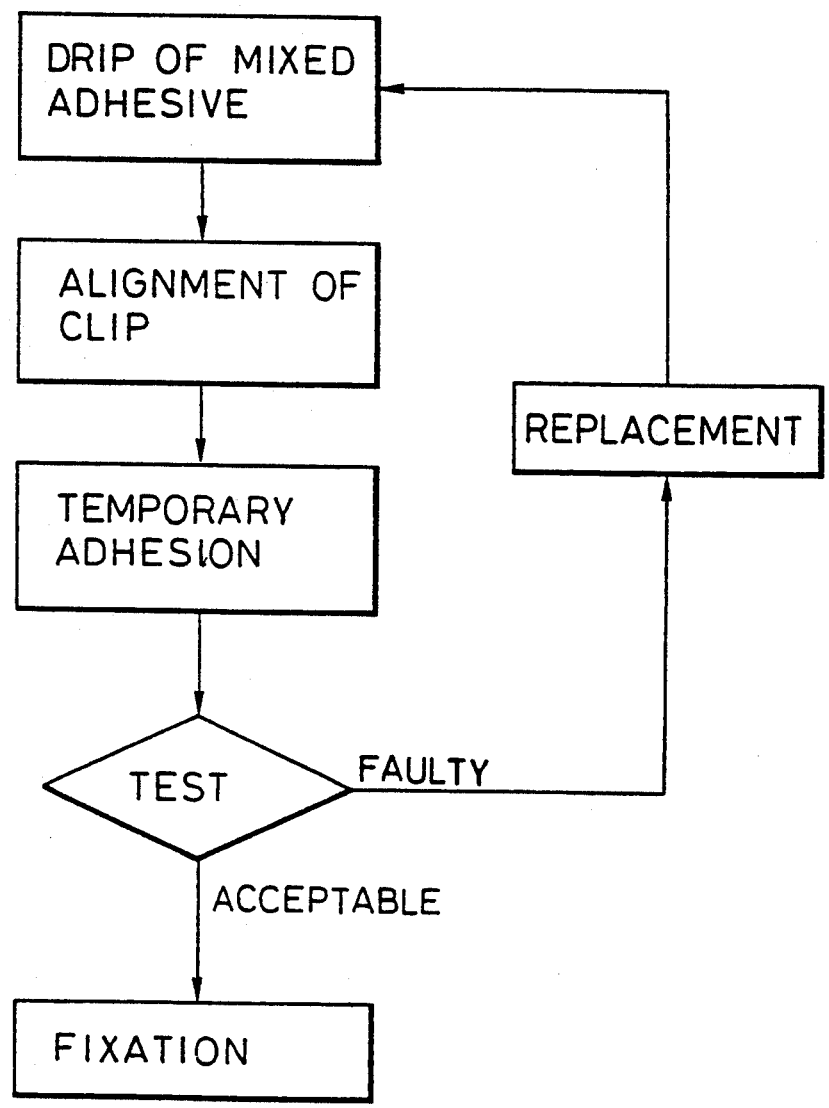
FIG. 4 is a flow chart for connecting an integrated circuit to an electric device in accordance with the present invention.

A general procedure of connecting an integrated circuit to an electric device is depicted in a flow chart of FIG. 4. First, a mixed adhesive comprising a photo-curable resin and a heat-curable resin is dipped onto an electric device where an IC chip is to be mounted. The ratio of photo-curable resin to the heat-curable resin is 1:9 for example. The IC chip is mounted on the electric device in order that the contacts of the chip are aligned with the counterpart contacts of the electric device. The IC chip is then temporarily adhered to the electric device by pressing to each other and exposing the adhesive to an ultraviolet light to cure only the photo-curable resin. The operation of the electric device connected with the IC chip is tested in order to determine whether the IC chip is faulty. If faulty, the IC chip mounted is replaced by a new article thereof followed by repeating the same test. If faultless, the IC chip is fixed to the electric device by heating to cure the heat-curable resin. In this process, the photo-curable resin may be used for fixing whereas the heat-curable resin may be used for temporary adherence. In this case, the temporary adherence is carried out by heating whereas the fixing by exposure to a light. The ratio of photo-curable resin to the heat-curable resin is 9:1 in this case.

Referring again to FIG. 2 together with FIG. 4, a method of connecting an IC chip to an electric device in accordance with a first embodiment of the present invention will be explained. A quarts glass substrate 30, as part of the electric device, is coated with an ITO film. The thin ITO film is patterned by photolithography in order to provide a desired circuit including a terminal 31. The terminal 31 is partly coated, by electroless plating, with an Ni film of 0.5 micrometer thickness thereon and then coated with an Au film of 0.05 micrometer thickness to provide an Au contact. On the other hand, Au is coated to a thickness of 20 micrometer thickness by electroless plating on an Al terminal 33 of an IC chip 32. The Au terminal 33 has been coated with a Ti film in advance so that an Au bump 34 is provided to make good ohmic contact with the underlying Al terminal.

On the other hand, an adhesive is prepared by mixing 15 parts of a photo-curable organic resin and 85 parts of a heat-curable organic resin. The adhesive is dripped onto the surface of the substrate 30 where the IC chip 32 is to be mounted. The IC chip is carefully mounted on the substrate 30 in order that the bump 34 is exactly aligned with the Ni-Au contact of the ITO film 31. A pressure is applied to the IC chip 32 to make electrical contact between the bump 34 and the contact (Au-Au contact). The adhesive is then exposed to a ultraviolet light for 300 seconds through the glass substrate 30. The wavelength of the light is 365 nm. The exposure hardens only the photo-curable resin contained in the adhesive 35 and temporarily adheres the IC chip 32 to the glass substrate 30.

The IC chip 32 is then tested through operation of the circuit formed on the substrate. If the IC chip is faultless, the adhesive 35 is placed in an oven and heated in a nitrogen atmosphere at 120° C. for 15 minutes in order to fix the IC chip 32 to the substrate 30. If the IC chip 32 is faulty, the adhesive 35 is dipped and soaked in a suitable solvent or thinner for 60 seconds followed by removing the IC chip 32 from the substrate 30 by a small mechanical force. The remaining adhesive 35 is completely removed by the solvent to reproduce a fresh surface of the substrate 30. The substrate 30 is then provided with another IC chip by means of the adhesive and subjected under the test again. The connection resistance between the IC chip and the circuit of the substrate was measured, as shown in the following table, wherein the replacement of the IC chip was repeated for several times on the same electric device. As understood from the table, the connection resistance was little changed even by the replacement.

TABLE

| Replacement | 0 | 1 | 2 | 3 | 4 | 5 | 10 | 20 (times) |
|---|---|---|---|---|---|---|---|---|
| Resistance | 0.5 | 0.4 | 0.5 | 0.6 | 0.5 | 0.6 | 0.6 | 0.6 (ohm) |

Figure 1:
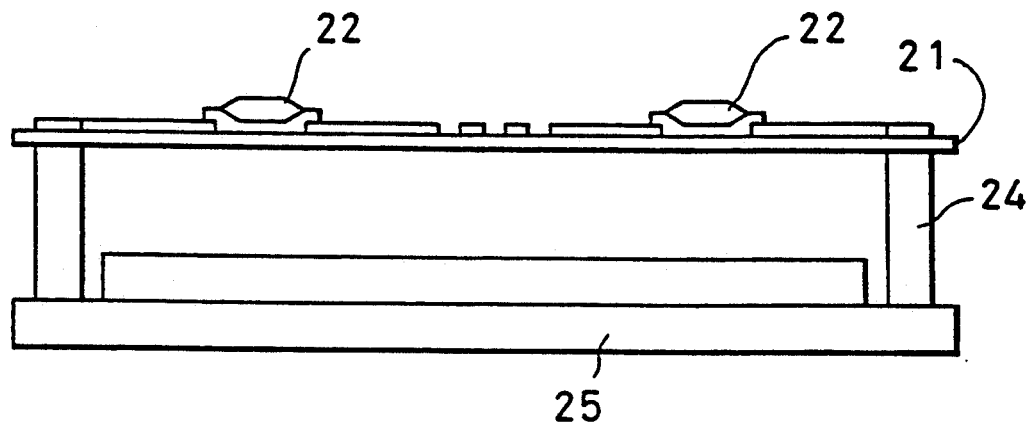
FIG. 1 shows a conventional method of electrically connecting an integrated circuit to an electric device.
Figure 2:
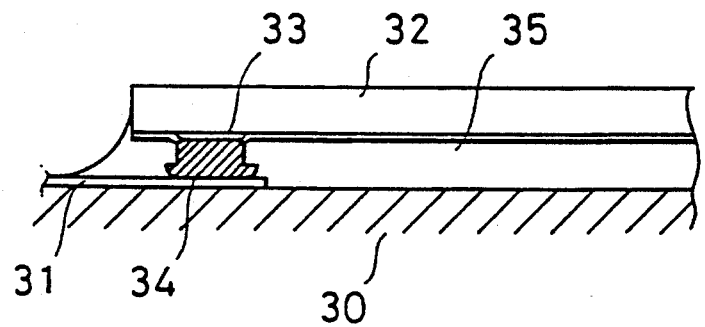
FIG. 2 is a cross sectional view showing the COG technique employed for connecting an integrated circuit to an electric device in accordance with the present invention.
Figure 3:
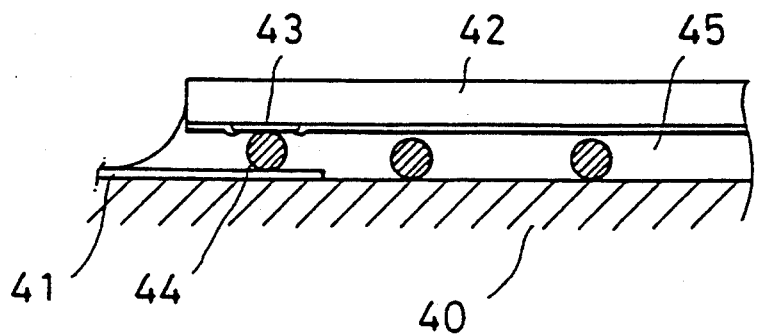
FIG. 3 is a cross sectional view showing another type of the COG technique employed for connecting an integrated circuit to an electric device.

FIGS. 2 and 4 can be referred to again for describing a method of connecting a semiconductor integrated circuit to an electric device formed on a sodalime glass substrate in accordance with a second embodiment of the present invention. The integrated circuit 32 comprises a quartz glass plate on which thin film transistors and other necessary electric elements and wiring are formed. The quartz glass plate is typically stick-like shaped (called "stick" or "stick crystal"). The sodalime glass substrate 30 is coated with an ITO film which is then patterned by photolithography in order to provide a desired circuit including a terminal 31. The terminal 31 is partly coated with an Ni film of 0.5 micrometer thickness thereon and then coated with an Au film of 0.05 micrometer thickness by electroless plating to provide an Au contact. On the other hand, Au is coated to a thickness of 20 micrometer thickness by electroless plating on an Al terminal 33 of the integrated circuit 32. The Au terminal 33 has been coated with a Ti film in advance of the Au coating so that an Au bump 34 is provided to make good ohmic contact with the Al terminal.

On the other hand, an adhesive is prepared by mixing 15 parts of a photo-curable organic resin and 85 parts of a heat-curable organic resin. The adhesive is dripped onto the surface of the substrate 30 where the integrated circuit 32 is to be mounted. The IC chip is carefully mounted on the substrate 30 in order that the bump 34 is exactly aligned with the Ni-Au contact of the ITO film 31. A pressure is applied to the integrated circuit 32 to make electrical contact between the bump 34 and the contact (Au-Au contact). The adhesive is then exposed to a ultraviolet light for 300 seconds through the quartz glass plate. The wavelength of the light is 365 nm. The exposure hardens only the photo-curable resin contained in the adhesive 35 and temporarily adheres the integrated circuit 32 to the glass substrate 30.

The integrated circuit 32 is then tested. If the integrated circuit 32 is faultless, the adhesive 35 is placed in an oven and heated in a nitrogen atmosphere at 120° C. for 15 minutes in order to fix the integrated circuit 32 to the substrate 30. If the integrated circuit 32 is faulty, the adhesive 35 is dipped and soaked in a suitable solvent or thinner for 60 seconds followed by removing the integrated circuit 32 from the substrate 30 by the use of a small mechanical force. The remaining adhesive 35 is also completely removed by the solvent to reproduce a fresh surface of the substrate 30. The substrate 30 is then provided with another semiconductor integrated circuit formed on a quarts plate by means of the adhesive and subjected under the test again in the same manner.

Figure 5A:
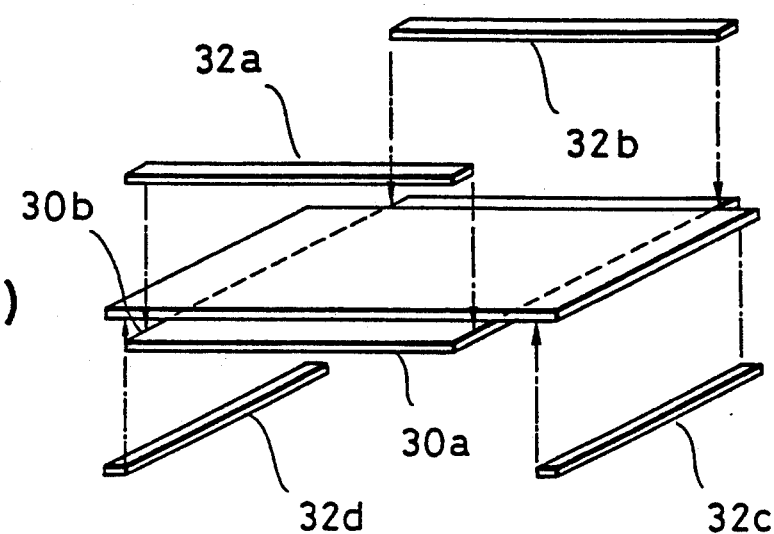
FIG. 5(A) is a perspective view illustrating a method for connecting an integrated circuit to an electric device in accordance with the present invention.

Referring now to FIG. 5(A), a method of connecting four semiconductor integrated circuits with a liquid crystal display panel in accordance with a third embodiment of the present invention will be described. The integrated circuits are provided for supplying scanning signals and data signals to the display.

Each integrated circuit comprises a glass plate (Corning 7059) on which thin film transistors and other necessary electric elements and wiring are formed. The thin film transistors are fabricated by a low temperature process including laser annealing. Two of the integrated circuits are scanning drivers for generating scanning signals. The other two integrated circuits are data drivers for generating data signals. The glass plates for the scanning drivers are 5 mm wide, 5 cm long and 1.1 mm thick and provided with 480 terminals 100 micrometers distant from each other. The glass plates for the data drivers are 5 mm wide, 7 cm long and 1.1 mm thick and provided with 640 terminals 100 micrometers distant from each other. These terminals are partly coated with a Ni film and Au bumps are formed thereon to a thickness of 20 micrometers in the same manner as the foregoing embodiments.

On the other hand, two Corning 7059 glass substrates are provided for forming the liquid crystal display panel. One of the glass substrates is 5 cm wide, 10 cm long, and 1.1 mm thick and formed with 640 parallel electrode lines extending in the length direction. The other is 7 cm wide, 6 cm long and 1.1 mm thick and formed with 480 parallel electrode lines extending in the length direction. These electrode lines are made of ITO. The terminals of these electrode lines are coated with a Ti film of 0.5 micrometer thickness thereon and then coated with an Au film of 0.05 micrometer thickness to provide Au contacts. The two substrates are joined in order that these electrode lines are orthogonally arranged to form a screen comprising 640×480 pixels at the intersections. A liquid crystal material is disposed between the substrates with a sealing member at the periphery provided in order to avoid loss of the liquid crystal material.

The data drivers 32a and 32b are then mounted on opposed edges of the substrate 30a which are projected from the other substrate 30b. The scanning drivers 32c and 32d are then mounted on opposed edges of the substrate 30b which are projected from the other substrate 30a. The connection of these drivers with the substrates are made in the same manner as described supra in conjunction with FIG. 2 utilizing an adhesive comprising 15 parts of a photo-curable organic resin and 85 parts of a heat-curable organic resin. The adhesive is then exposed to a ultraviolet light for 600 seconds through the glass plates and the substrates. The wavelength of the light is 365 nm. The exposure hardens only the photo-curable resin contained in the adhesive and temporarily adheres the drivers to the substrates. It is because the transparency of the Corning glass is inferior to that of quartz glass that the exposure time is selected to be longer than that for the preceding embodiment. It is desirable in this case that the drivers and the liquid crystal panel are formed on the glass substrates made of the same material so that separation due to the difference in thermal coefficient shall not occur even during thermal treatment.

Figure 5B:
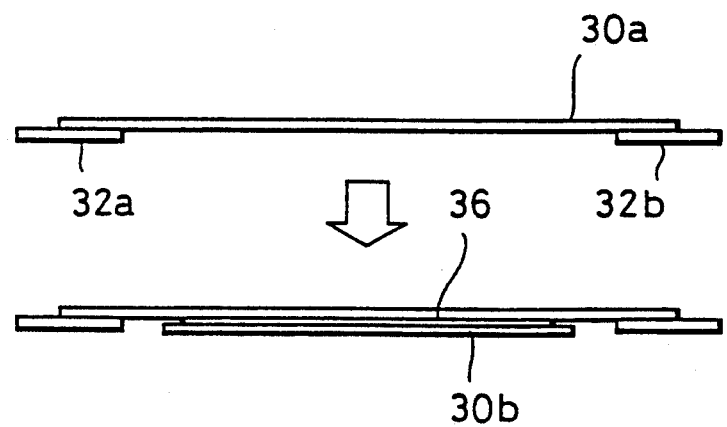
FIG. 5(B) is a cross sectional view illustrating a method for connecting an integrated circuit to an electric device in accordance with the present invention.
Figure 5C:
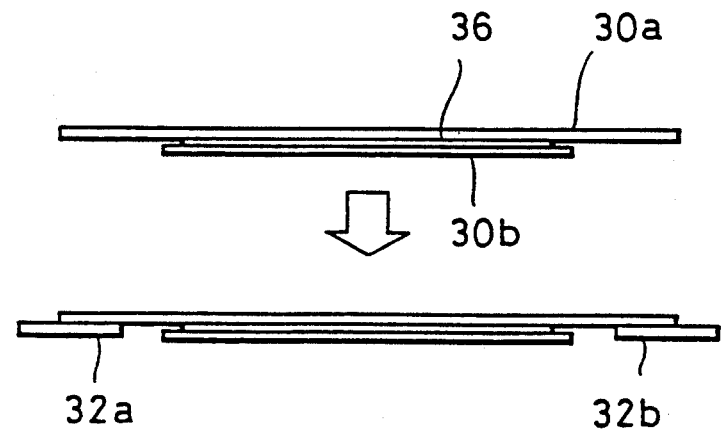
FIG. 5(C) is a cross sectional view illustrating a variation of the method as shown in FIG. 5(B) for connecting an integrated circuit to an electric device in accordance with the present invention.

Alternatively, the drivers 32a to 32d can be mounted and temporarily adhered to the substrates 30a and 30b in advance of joining the substrates 30a and 30b as schematically illustrated in FIG. 5(B) rather than the above described procedure as illustrated in FIG. 5(C). In this case, however, mechanical damage may be applied to the connection between the drivers and the substrates when a liquid crystal material is charged into the spacing between the substrates.

The operation of the liquid crystal display is then tested. If the operation is faultless, the adhesive is placed in an oven and heated in a nitrogen atmosphere at 120° C. for 15 minutes in order to fix the drivers to the substrates. If the operation is faulty, a faulty driver(s) is replaced by a new article of the driver in the same manner as the preceding embodiment.

The above explanation is made in the case of a liquid crystal display utilizing the simple matrix driving mode. In the case for the active matrix mode utilizing TFTs, both the drivers for data supply and scanning are formed on one of the substrates. In this case, however, the above procedure can be also applied without substantial modification.

In the case of conventional liquid crystal display panels, 6–10 IC chips are necessary for each of scanning or data supplying drivers so that unsightly complicated circuit configuration has to be arranged around the panel. In accordance with the embodiment of the present invention, the liquid crystal display system is made in a fashionable design with a compact peripheral having the rod-like drivers as shown in FIG. 5(A).

Since the reliability of thin film transistors formed on a glass substrate has been not so high yet, faulty operation has been often found so that the method according to the present invention is particularly effective in this case.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A method of electrically connecting an integrated circuit to an electric device comprising the steps of:

mounting said integrated circuit on said electric device with an adhesive disposed therebetween in order that terminals of said integrated circuit and said electric device to be electrically coupled are aligned with each other, said adhesive comprising a mixture of different substances which are cured in different conditions;

curing one of said different substances of the same adhesive in a first curing condition in order to temporarily adhere said integrated circuit to said electric device;

testing either or both of said integrated circuit and the electrical connection thereof with said electric device; and fixing said integrated circuit to said electric device by curing another of said different substances in a second curing condition different than said first curing condition.

2. The method of electrically connecting an integrated circuit to an electric device as claimed in claim 1 further comprising a step of pressing said integrated circuit to said electric device after said mounting step in order to insure electrical connection between the terminals of said integrated circuit and said electric device.

3. The method of electrically connecting an integrated circuit to an electric device as claimed in claim 1 wherein the proportion of the said different substance curable in said first condition is no more than 20% of said mixture.

4. The method of electrically connecting an integrated circuit to an electric device as claimed in claim 1 wherein said different substance curable in said first condition is a photo-curable resin.

5. The method of electrically connecting an integrated circuit to an electric device as claimed in claim 4 wherein said different substance curable in said second condition is a heat-curable resin.

6. The method of electrically connecting an integrated circuit to an electric device as claimed in claim 1 wherein said integrated circuit is an IC chip.

7. The method of electrically connecting an integrated circuit to an electric device as claimed in claim 1 wherein said integrated circuit comprises thin film transistors formed on a substrate.

8. The method of electrically connecting an integrated circuit to an electric device as claimed in claim 1 wherein said substrate is a glass substrate.

9. The method of electrically connecting an integrated circuit to an electric device as claimed in claim 1 wherein said substrate is a quartz substrate.

10. The method of electrically connecting an integrated circuit to an electric device as claimed in claim 1 wherein said electric device is a liquid crystal display panel.

11. The method of electrically connecting an integrated circuit to an electric device as claimed in claim 1 wherein said electric device is a thermal head.

12. The method of electrically connecting an integrated circuit to an electric device as claimed in claim 1 wherein said electric device is a LED array.

13. A method of electrically connecting an integrated circuit to an electric device comprising the steps of:

mounting said integrated circuit on said electric device with an adhesive disposed therebetween in order that terminals of said integrated circuit and said electric device to be electrically coupled are aligned with each other, said adhesive comprising a mixture of different substances which are cured in different conditions;

curing one of said different substances of the same adhesive in a first curing condition in order to temporarily adhere said integrated circuit to said electric device;

testing either or both of said integrated circuit and the electrical connection thereof with said electric device; and fixing said integrated circuit to said electric device by curing another of said different substances in a second curing condition different than said first curing condition, wherein the proportion of said different substance curable in said first condition is 2% to 20% of said mixture.

14. A method of mounting an IC chip on a substrate comprising the steps of:

placing an IC chip on a substrate having wirings with a curable adhesive mixture therebetween so that terminals of said IC chip are coupled with corresponding terminals of said wirings, said adhesive mixture comprising two different adhesives which are curable by different conditions;

curing one of said adhesives in order to temporarily attach said chip to said substrate;

testing an operation of said IC chip; and curing the other one of said adhesives in order to tightly attach said chip to said substrate.

15. The method of claim 14 wherein said substrate is for a liquid crystal panel.

16. The method of claim 14 wherein said substrate is glass.

17. The method of claim 15 wherein said wirings are conductive strips.

18. The method of claim 15 wherein said one of the adhesives is photocurable adhesive and the other one is heatcurable adhesive.

* * * * *